(12) United States Patent
Ben Artsi

(10) Patent No.: US 8,884,644 B1
(45) Date of Patent: *Nov. 11, 2014

(54) IMPEDANCE DISCONTINUITY COMPENSATOR FOR ELECTRONIC PACKAGES

(75) Inventor: Liav Ben Artsi, Nahariya (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 56 days.

This patent is subject to a terminal disclaimer.

(21) Appl. No.: 13/617,770

(22) Filed: Sep. 14, 2012

Related U.S. Application Data

(63) Continuation of application No. 12/140,774, filed on Jun. 17, 2008, now Pat. No. 8,274,307.

(60) Provisional application No. 60/944,650, filed on Jun. 18, 2007.

(51) Int. Cl.
*H03K 17/16* (2006.01)
*H03K 19/003* (2006.01)
*H03K 3/00* (2006.01)
*H03B 1/00* (2006.01)
*H03H 7/38* (2006.01)

(52) U.S. Cl.
USPC ............................... 326/30; 327/108; 333/32

(58) Field of Classification Search
CPC ............ H04L 25/0278; H04L 25/0298; H04L 25/028; H03K 19/0005; G06F 13/4086
USPC .......................... 326/30; 333/32–34; 327/379
See application file for complete search history.

(56) References Cited

U.S. PATENT DOCUMENTS

| | | | |
|---|---|---|---|
| 6,043,556 A * | 3/2000 | Tomie | 257/664 |
| 6,639,487 B1 * | 10/2003 | Salmela et al. | 333/34 |
| 6,677,831 B1 * | 1/2004 | Cheng et al. | 333/34 |
| 6,911,880 B2 | 6/2005 | Arai et al. | |
| 6,980,063 B2 | 12/2005 | Mikalauskas | |
| 7,145,411 B1 | 12/2006 | Blair et al. | |
| 7,154,411 B2 | 12/2006 | Ciglenec et al. | |
| 7,218,183 B2 * | 5/2007 | Kim et al. | 333/33 |
| 7,446,624 B2 | 11/2008 | Kashiwakura | |
| 7,609,125 B2 | 10/2009 | van Quach et al. | |
| 7,671,450 B2 * | 3/2010 | Nease et al. | 257/664 |
| 8,274,307 B1 * | 9/2012 | Ben Artsi | 326/30 |
| 2002/0189849 A1 * | 12/2002 | Hirose et al. | 174/250 |
| 2006/0082378 A1 | 4/2006 | Majerus et al. | |
| 2009/0152689 A1 * | 6/2009 | Nease et al. | 257/664 |
| 2009/0284324 A1 | 11/2009 | Van Quach et al. | |

OTHER PUBLICATIONS

U.S. Appl. No. 12/725,119, filed Mar. 16, 2010, Liav Ben Artsi.

* cited by examiner

*Primary Examiner* — Dylan White

(57) ABSTRACT

The present disclosure provides for a circuit package that can include a signal input port that receives an electronic signal that includes multiple frequency components and a signal output port that outputs the electronic signal. The circuit package can include a trace having multiple portions that have a portion-dependent impedance. The trace can transfer the electronic signal from the signal input port to the signal output port. The present disclosure provides an apparatus to compensate a package trace parasitics, such as parasitic capacitance, to improve signal fidelity over a predetermined frequency range. The apparatus can provide a broadband impedance matching structure that matches the impedance of an I/O cell to the impedance of a printed circuit board and can compensates for the parasitic effects of both the I/O cell, terminals, and other discontinuities that may be present within the package.

22 Claims, 6 Drawing Sheets

IMPEDANCE DISCONTINUITY COMPENSATOR FOR ELECTRONIC PACKAGES

INCORPORATION BY REFERENCE

This is a continuation of U.S. application Ser. No. 12/140,774, filed on Jun. 17, 2008, now issued as U.S. Pat. No. 8,274,307, which claims the benefit of U.S. Provisional Application No. 60/944,650, "A Method to Overcome Capacitive/Inductive Discontinuities in Package Design" filed on Jun. 18, 2007, which is incorporated herein by reference in its entirety.

BACKGROUND

A semiconductor chip can generate or receive a high-speed I/O signal at an input or output (I/O) cell and may conduct the signal to or from a package terminal. The high-speed I/O signals may travel on transmission lines that are intended to maintain signal fidelity over a distance. The I/O cell may be a group of integrated active and passive elements. The package terminal may couple the semiconductor chip to external devices.

The semiconductor chip I/O cell may couple the high-speed I/O signal to a differential pair based transmission line, a single-ended transmission line, or a waveguide. A differential pair based transmission line may include one or more ground planes. A single-ended transmission line can refer the high-speed I/O signal to a ground plane.

The differential pair has a proximal and a distal end that can couple to the I/O cell and one or more package terminals, respectively. For example, a transmission line can couple a signal from the I/O cell to a solderable package pin, a flat lead, a J-lead, an S-lead, or a solder ball in a ball grid array (BGA) package. The transmission line may be interrupted by a routing via, such as a package via, a blind via, a buried via, and the like, and may be terminated at either end by resistances, capacitances, and reactances that impose impedance discontinuities. For example, a capacitive discontinuity may occur at either end of a package trace. A capacitance discontinuity together with the length of a trace may limit signal transmission. For example, both the I/O cell and the package-to-board coupling element or linkage may have some parasitic capacitance. Accordingly, the capacitive discontinuities at either end of the trace may be a result of the I/O cell being characterized by some amount of parasitic capacitance and the package linkage to the board, such as a BGA ball, being also characterized by some amount of capacitance.

SUMMARY

The present disclosure provides for a circuit package that can include a signal input port that receives a broadband electronic signal carrying plural frequency components and a signal output port that outputs the broadband signal. The circuit package can include a trace having multiple portions that have a portion-dependent impedance. The trace can transfer the broadband signal between the signal input port and the signal output port. Individual traces can be configured to have a different impedance at different longitudinal portions, for example by changing the thickness of the trace. Pairs of traces that carry differential signals can also be configured to have different impedance at different locations, for example by changing an intra-pair distance, by changing the trace width, and the like. Moreover, the impedance may be configured by adjusting a spacing between traces and a ground plane in the package. The spacing to the ground plane can be adjusted by referencing the trace to a nearby ground plane or to another, more distant ground plane.

The present disclosure also provides for a method for reducing signal loss of a broadband signal in integrated circuit package. The method can include receiving a broadband electronic signal at a signal input port, terminating the broadband signal at a signal output port, and transferring the broadband signal from the signal input port to the signal output port over a trace that has multiple portions characterized by a portion-dependent characteristic impedance. Each portion may have a specific length that is optimally configured to reduce discontinuity.

An electronic package may include a proximal transmission segment that couples a broadband signal to/from a semiconductor that has a characteristic impedance (that may have some capacitive characteristic), a distal transmission segment that conducts the signal to/from the edge of the packages, which is characterized by its impedance (and may also have some capacitive characteristics), and an optimized transmission segment that maximizes the fidelity of the broadband signal conducted to the load over a predefined frequency band of the broadband signal.

BRIEF DESCRIPTION OF THE DRAWINGS

The disclosure will refer to the accompanying figures, wherein like numerals represent like elements, and wherein.

DETAILED DESCRIPTION OF EMBODIMENTS

Figure 1:
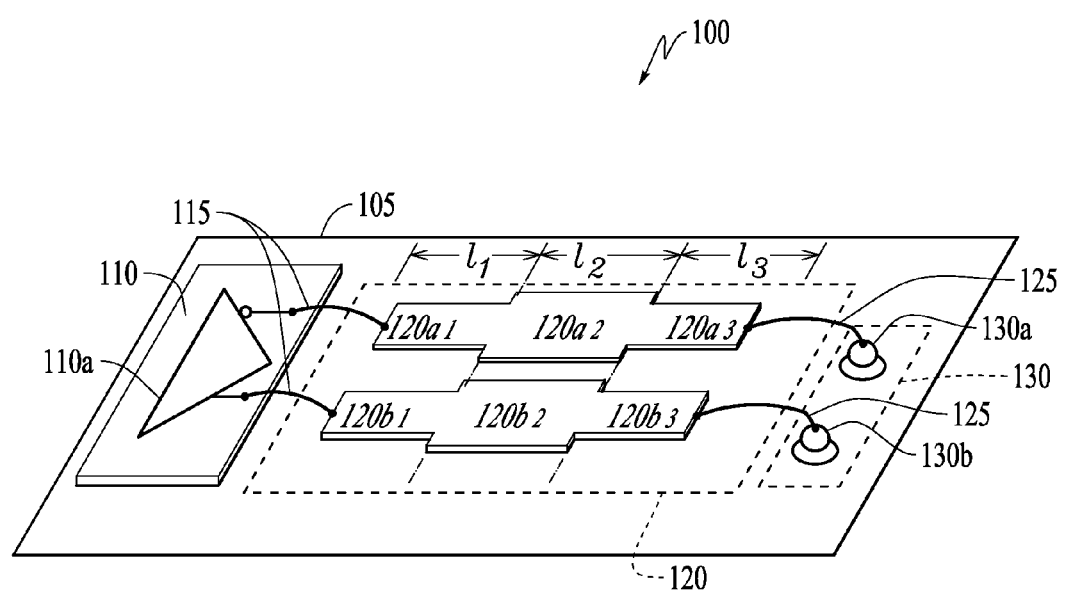
FIG. 1 shows an example of a semiconductor package.

FIG. 1 shows a simplified pictorial example of a semiconductor package 100 that can include a package body 105, a semiconductor chip 110 with an input-output (I/O) cell 110a, a first coupler 115, a transmission line 120, a second coupler 125, and a terminal 130. The I/O cell 110a of the semiconductor chip 110 may couple to the first coupler 115, which can couple to the transmission line 120. The transmission line 120 can couple to the second coupler 125, which can couple to the terminal 130, and can be configured to transmit differential signals.

The semiconductor chip 110 may be an integrated circuit (IC) based on silicon technology, such as complementary metal oxide semiconductor (CMOS) or bipolar junction transistor (BJT), technology, or a compound semiconductor technology, such as gallium arsenide (GaAs), indium phosphide (InF), silicon-germanium (Si—Ge), and the like. The semiconductor chip 110 may be a die or singulated semiconductor chip, a flip-chip the stack, a hybrid microcircuit that includes active and passive microelectronic components, and the like. The semiconductor chip 110 may be a broadband communications chip, a memory, an application specific integrated circuit (ASIC), a processor, and the like. For example, the semiconductor chip 110 can be a serializer-deserializer (SERDES) that is bonded into the semiconductor package 100 or any device that incorporates a SERDES port.

The I/O cell 110a can generate or receive high-speed digital or analog I/O signals. For example, the I/O cell 110a can generate or receive a signal that has a 3.125 Gbps line rate or data-signaling rate that complies with a 10 Gbps XAUI standard. The I/O cell 110a may include circuits that pre-emphasize, equalize, discriminate, and the like. For example, the I/O cell 110a can include a pre-driver that pre-emphasizes a signal.

The impedance of the I/O cell 110a may include intrinsic capacitances, inductances, resistances, or a combination of resistive and reactive components. The impedance of the I/O cell 110a may or may not be purely resistive. In other words, the impedance of the I/O cell 110a may be frequency-dependent and may change from exhibiting an equivalent capacitive reactance component to an equivalent inductive reactance component in one or more frequency bands. The frequency dependent impedance of the I/O cell 110a and the terminals 130 may be measured using a vector network analyzer (VIA) and displayed in terms of time domain reflectometry (TDR) plots, Smith charts, return loss frequency domain plots, and the like. For example, the parasitic capacitance of the I/O cell may also be estimated using extractors and spice I/V curve simulation. The impedances of the I/O chip 110a may be regarded as constraints with respect to methods for optimizing the transfer characteristics of the transmission line 120.

The package body 105 can hold and support the semiconductor chip 110, the first and second couplers 115-125, the transmission line 120, and the terminal 130. The package body 105 may have an industry standard form factor or a custom form factor. For example, the package can be a plastic BGA (PBGA) with 448 terminals, a quad flat pack (QFP), a chip substrate planar (CSP) package, a glob-top encapsulated package, and the like. The package body 105 may be mounted to a PCB (not shown), under-filled by a stress mitigating material (not shown), or otherwise subject to determinable impedance changes and capacitive discontinuities at the terminal 130 from package attachment methods and conditions of use.

The first and second couplers 115-125 may exhibit impedance discontinuities, relative to a transmission line 120 impedance, in addition to the impedance discontinuities of the I/O cell 110a and the terminal 130. The first and second couplers 115-125 can couple high-speed I/O signals onto or off the transmission line 120. For example, the first and second couplers 115-125 can resistively, inductively, or capacitively couple the high-speed signal between different materials systems, such as between an IC bond pad and a gold-plated nickel lead frame.

The first and second couplers 115-125 may be inductive, such as ball-wedge wire bonds, wedge-wedge wire bonds, ribbon bonds, ultrasonically welded leads, solder leads, capacitive couplers, and the like. For example, the bond wires can be 1 mil, i.e., 0.001 inch, aluminum or gold bond wires that are ultrasonically welded to a pad of the I/O cell 110a. The first and second couplers 115-125 may couple broad-band, high line rate signals between the I/O cell 110a and the terminal 130. A broadband signal may occupy a bandwidth that is a significant fraction of a digital symbol rate, bit rate, or line rate.

The first and second couplers 115-125 may exhibit an impedance mismatch or discontinuity between the I/O cell 110 and transmission line 120 and between the transmission line 120 and terminal 130, respectively. For example, the coupler 115 may exhibit an inductive reactance or impedance discontinuity due to a ball-wedge wire bond. The first coupler may also be a bump and a via of a flip-chip package. The second coupler may be a substrate via of the package substrate.

The transmission line 120 may include transmission segments 120a1, 120a2, 120a3, 120b1, 120b2, and 120b3 that conduct the high-speed I/O signal to the terminal 130. The transmission segments 120a1, 120a2, 120a3, 120b1, 120b2, and 120b3 may also be described as longitudinal portions, each of which may be associated with an transmission line impedance, such as a differential impedance, a characteristic impedance, an odd mode impedance, and the like. The impedance of one segment may be described as different than the impedance of another segment when the impedances differ significantly in magnitude, phase, or both magnitude and phase.

The total length of the transmission line 120 can be described as a package routing length or a trace length. The length may be a fixed distance, such as a straight point to point distance, the arc length of a curve, the sum of lengths of linear segments, the length of a microwave meander, and the like. The trace properties, including length, width, and thickness, may be configurable at a manufacturing step either before or after the semiconductor chip 110 is bonded or assembled into the package 100. For example, the trace may be configured or adjusted by laser trimming, in-situ etching, and the like, after the semiconductor chip 110 is bonded into the package 100.

The transmission line 120 may be an impedance-controlled structure, such as a microstrip, a stripline, a slotline, a ridge waveguide, a coplanar waveguide (CPW) transmission line or a set of ground-signal-ground (GSG) traces, a set of ground-signal-ground-signal-ground (GSGSG) traces, and the like. The transmission line 120 can couple single-ended or differential signals to a corresponding number of elements of terminal 130, such as terminals 130a and 130b.

It may be noted that the position of the transmission segments 120a2 and 120b2 may vary from the center position of transmission line 120. In other words, the lengths of transmission segments 120a1-120b1 and 120a2-120b2, denoted $l_1$ and $l_2$, respectively, and the impedance of the middle or center transmission segments 120a2 and 120b2 may be adjusted by a performance-optimizing method that reduces the insertion loss and maximizes the return loss of the signal path from I/O cell 110a to terminal 130. It may be noted that the impedance of the sections 120a1, 120b1, 120a3, and 120b3 may also be changed to further optimize the insertion loss. The segments 120a2 and 120b2 may be described as optimized transmission segments. It may be noted that any or all segments of transmission line 120 may be adjusted, subject to constraints, so that the overall transmission and reflection characteristics of the transmission line 120 may be regarded as optimum. In other words, describing a given segment of the transmission line 120 as an optimum structure may not mean that other segments are not optimum. The benefits of constrained optimality may accrue to the entire transmission line 120. The constraints may include physical, electronic, manufacturing cost constraints, thermal constraints, environmental constraints, such as capacitive characteristics of the I/O cell, vias, package linkage to the board, and the like. The entire multi-segment transmission line 120 structure may be regarded as an impedance compensator or broadband matching network. For example, the multi-segment transmission line 120 may approximately match a generator impedance to a conjugate of a load or terminating impedance.

The performance-optimizing method can adjust the impedance of transmission segments, such as the parameters of 120a2-120b2, as well as $l_1$ and $l_2$. The performance-optimizing method can adjust $l_1$ and $l_2$ and a set of transmission line parameters that relate the impedance of transmission segments to physical features, such as trace widths, spacings, and segment lengths, and material electrical properties, such as the permittivity of the package material. For example, the odd mode impedance of transmission segments 120a2-120b2 can be reduced by moving the two conductors of a pair of package traces closer together, while maintaining the trace width. Likewise, the impedance of segments 120a2-120b2 can be adjusted by changing a spacing between the package traces and a ground layer in the package, for example, by selectively removing portions of a dielectric layer. It may be noted that package manufacturability and cost may be a function of trace width and trace spacing. As another example, increasing the width and simultaneously decreasing the intra-pair spacing of the two conductors can reduce the impedance of transmission segments 120a2-120b2. Other combinations of trace width and spacing adjustments may be made so that the transmission line 120 can provide a broadband match of the I/O cell 110a to the package terminals 130. The trace widths and spacings may be configurable at manufacturing either before or after the semiconductor chip 110 is bonded into the package 100. For example, the trace widths and spacings may be configured by in-situ mechanical trimming or cutting, laser trimming, reactive ion etching, gas phase etching, and the like.

A broadband signal may include a wide range of frequencies or a range of frequencies that is a substantial fraction of a digital signaling line rate, including fractions that exceed 100%. For example, a 40 Gbps return to zero (RZ) signal with 20% forward error correction coding (FEC) and a line rate of 48 GHz may include frequency components up to about 120 GHz. In another example, a 10 Gbps data non-return to zero (NRZ) signal may be transmitted at a 10 GHz line rate and may include frequency components up to about 7 GHz. In yet another example, a 3.125 Gbps broadband signal may include frequency components up to about 4 GHz.

A broadband match can cover a range of frequencies, which may be called in-band frequencies, that encompass the majority of the power spectral density (PSD) of a random or near random digital I/O signal. A broadband match may also cover a range of frequencies in excess of the digital signaling line rate such that group delay distortion of the in-band frequency components is much less than a bit period, such as one-tenth of a bit period. For example, a broadband matching characteristic, such as the characteristic provided by adjusting transmission segment 120a2-120b2, may apply to in-band frequencies within which a definite integral of the PSD, such as a cumulative distribution function of the PSD, is more than 90% of the total power in the random digital signal. The total power may be determined, for example, by integrating the PSD up to a frequency limit that exceeds the line rate. In another example, a broadband match may minimize the insertion loss from a low cutoff frequency to a predetermined frequency. The predetermined frequency may be set as a fraction of the line rate, for example, a 3.125 GHz broadband signal may be multiplied by 0.8 to get 2.5 GHz as the upper predetermined frequency.

It may be noted that the low frequency cutoff of a digital I/O signal, such as a serializer-deserializer (SERDES) signal, can be a small fraction of the line-rate. For example, the low cutoff frequency can be between DC and several hundred megahertz (MHz) for a SERDES signal operating at a 3.125 Gbps line rate, such as a XAUI-compliant channel. A desirable broadband match may be achieved for frequencies between the low frequency cutoff and an upper frequency determined from the rolloff in the PSD of the digital I/O signal. In other words, the PSD may be pre-determined for known transmission formats or line codes and the upper frequency may be pre-determined accordingly.

It may be noted that the transmission line 120 can include a differential pair of conductors, such as transmission line 120a and 120b. Each transmission line 120a-b can include multiple transmission segments, 120a1-120a3 and 120b1-120b3, respectively. The impedance of the differential pair of each segment may be described as a differential impedance or as a characteristic impedance.

The transmission line segments 120a2 and 120b2 may serve as a broadband impedance matching structure. In other words, the transmission line segments 120a2 and 120b2 may improve the impedance match between the I/O cell 110 and the terminal 130 over a bandwidth comparable to a signal bandwidth, such as a 3 dB bandwidth. The transmission lines segments 120a1-120a3 and 120b1-120b3 may be optimized to compensate for the I/O cell 110 capacitance characteristic and the package terminal 130 capacitive characteristic and so improve the impedance matching over a wide frequency range. To compensate for capacitive discontinuities at both ends, the inner section, transmission line segments 120a2 and 120b2, can advantageously have a lower impedance than transmission line segments 120a1, 120b1, 120a3, and 120b3. The lower impedance of transmission line segments 120a2 and 120b2 can advantageously increase the knee frequency. The broadband matching characteristic may be contrasted to other matching structures, such as quarter-wave transformers, that match impedances in a narrow frequency range. Quarter-wave transformers can be suitable for narrowband signals, such as narrowband frequency modulation (FM), pilot tones, and the like.

The terminal 130 can include package leads, pins, solderable leads, solder balls, and the like. For example, the terminal 130 can include reflowable or solderable Pb/Sn or Sb/Sn/Ag solder balls in a ball grid array (BGA). The semiconductor package 100 may be soldered to a PCB, a printed wiring board (PWB), and the like. For example, the terminal 130 may be mounted or attached to a PCB using solder reflow. The PCB can be a multi-layer board, such as an 18-layer, FR4 backplane, for example, or other suitable board.

The impedance of the terminal 130 may include intrinsic capacitances, inductances, resistances, or a combination of resistive and reactive components. The impedance of the terminal 130 may be frequency-dependent and may change reactance in one or more frequency bands, for example. The capacitance characteristic may be obtained for optimizing purposes by measurement, calculation or using 3-dimensional extractor tools, and the like.

The impedance of terminal 130 may include post-reflow or package mounting effects. For example, the terminal 130 may include extrinsic parasitic inductance, resistance, and capacitance between the semiconductor package 100 and the PCB board traces. In other words, the terminal 130 may include both intrinsic impedance discontinuities and parasitic or mounting effects. The impedance of terminal 130 may be measured up to a reference plane that includes a portion of traces on a PCB or PWB. The impedance of the terminal 130 may also include (for the matching optimization purpose) the parasitic effects of an attached board element, such as the capacitance of a board through-hole via structure or the capacitance of a pad used to solder the device balls on.

The impedance of the semiconductor I/O cell 110a may include parasitic effects such as parasitic capacitance causing its total impedance to shift from being an ideal resistance. The transmission lines 120 can be regarded as a broadband impedance matching structure that matches the ideal resistance portion of the I/O cell 110a with the ideal target impedance of the printed PCB (connected to terminals 130a and 130b) and compensates or takes into account the parasitic effects of both the I/O cell 110a and the terminals 130 as well as any other discontinuity that may be present within the package, such as wire bonds, vias, and the like.

Figure 2:
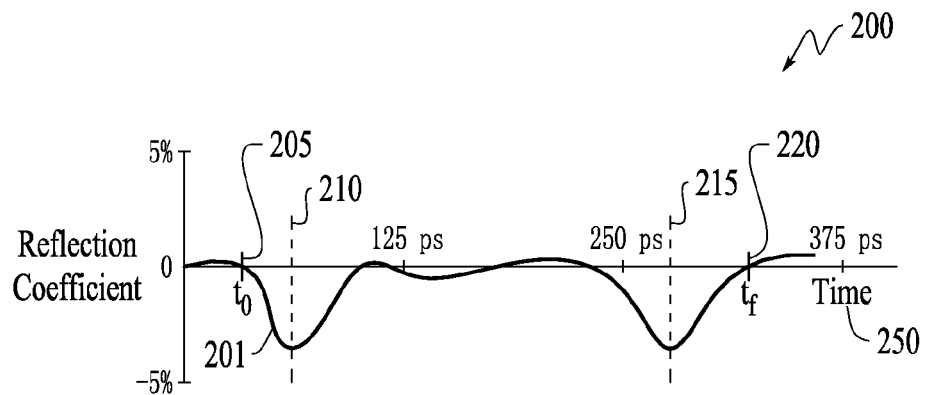
FIG. 2 shows an example of a time domain reflectometry (TDR) plot.

FIG. 2 shows an example of a time domain reflectometry (TDR) plot 200 that includes a TDR plot 201, a starting time $t_0$ 205, a first reflection 210, a second reflection 215, an ending time $t_f$ 220 and a time axis 250. The TDR plot 200 can show a voltage reflection coefficient as a function of time. Reflections can be caused by impedance discontinuities between or within high-speed sources or generators, transmission structures, and signal destinations or loads. An impedance discontinuity may be evident from a TDR plot of a reflection coefficient or impedance versus time. The reflection coefficient versus time plot may be converted to an impedance versus time plot and vice versa. For example, for a 100Ω differential impedance transmission line, a TDR reflection plot, such as TDR plot 201, may be transformed into a TDR plot using a 100Ω differential impedance reference.

An impedance discontinuity can occur between the I/O cell 110 and terminal 130, or vice versa, when a TDR plot exhibits a localized impedance that is different than a differential, common, even-mode, odd-mode, or characteristic impedance, and the like, of the transmission line 120. For example, the I/O cell 110a and the terminal 130 may exhibit 1.5 pF capacitive discontinuities with respect to a differential impedance of the transmission line 120.

The starting time of TDR plot 200, $t_0$ 205, and the ending time, $t_f$ 220, can be described as user-defined starting and ending times. For example, $t_0$ 205 and $t_f$ 220 may correspond to phase reference planes normal to the direction of signal propagation. The phase reference plan may be located on an I/O cell 110a bond pad and the terminal 130. The TDR plot 200 can be obtained using microwave probe techniques that de-embed a microwave probe impedance, a probe pad impedance, or other measurement artifacts.

The TDR plot 201 may exhibit the effects of impedance discontinuities such as the first and second reflections 210 and 215. The first and second reflections 210 and 215 can quantify the degree of mismatch of an impedance continuity relative to a transmission line impedance, such as a differential impedance. For example, the first and second reflections 210 and 215 may be caused by capacitive discontinuities and may result in a negative-going reflection coefficient. It may be noted that while TDR plot 201 shows the first and second reflections 210 and 215 from capacitive discontinuities, inductive discontinuities may be present instead or in addition. It may also be noted that in non-uniform transmission lines, the time axis 250 may not correspond exactly to a propagation distance. In other words, the speed of propagation along a non-uniform transmission line, such as a multi-segment transmission line, may change as a function of propagation distance.

Figure 3:
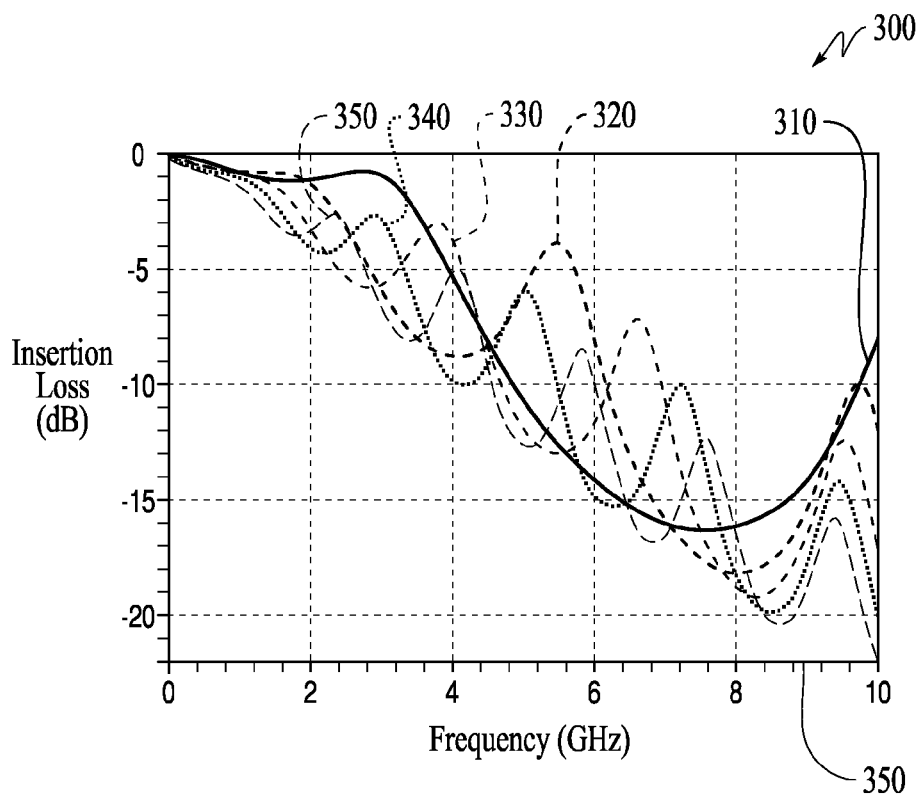
FIG. 3 shows an example of frequency domain plots.

FIG. 3 shows an example of frequency domain plots 300 that quantify the transmission and insertion loss in decibels (dB) as a function of frequency for five lengths of transmission line. The insertion loss may expressed in dB by negating the sign of the transmission in dB and vice versa. Plots 310, 320, 330, 340, and 350 apply to examples of frequency domain plots for transmission line lengths of 10, 20, 30, 40 and 50 mm, respectively, when 1) an I/O cell 110a capacitive characteristic of 1.5 pF forms an impedance discontinuity, 2) a terminal 130 capacitive characteristic of 1.5 pF forms an impedance discontinuity, and 3) the transmission line is a differential transmission line having a 100Ω differential impedance. Each plot 310-350 exhibits a knee frequency that decreases as the transmission line length increases. For example, plots 310-350 can exhibit a knee frequency of approximately 2.9, 1.6, 1.4, 1.2, and 1.1 GHz. It may be noted that while the ordinate of frequency-dependent plot 300 is insertion loss dB, that a transmission coefficient, the opposite of a true loss, between an I/O cell 110a and a package terminal 130 may be understood. For example, the insertion loss plot may represent a nearly ideal transfer characteristic when the insertion loss is approximately 0 dB up to the line rate then exhibits a knee behavior. For example, a nearly ideal frequency dependent plot may roll off at approximately a digital signaling line rate and do so slowly enough so that the group delay distortion in the channel characteristic or frequency-response is significantly less than a bit or symbol period. In other words, the frequency-response may exhibit a linear phase characteristic over a pre-determined frequency band of the broadband digital I/O signal. The pre-determined frequency band can include DC up to a pre-determined upper frequency, such as 2.5 GHz. The bit or symbol period can be described as the reciprocal of the line rate and vice versa. It may be noted that trace loss characteristics, such as skin effect and dielectric loss, have been included in the calculation of the example plots 310, 320, 330, 340, and 350, however the main contributing effect to the loss above the knee frequency may be due to the impedance mismatch caused by the capacitive discontinuities and the group delay distortion that such capacitive discontinuities create.

Figure 4:
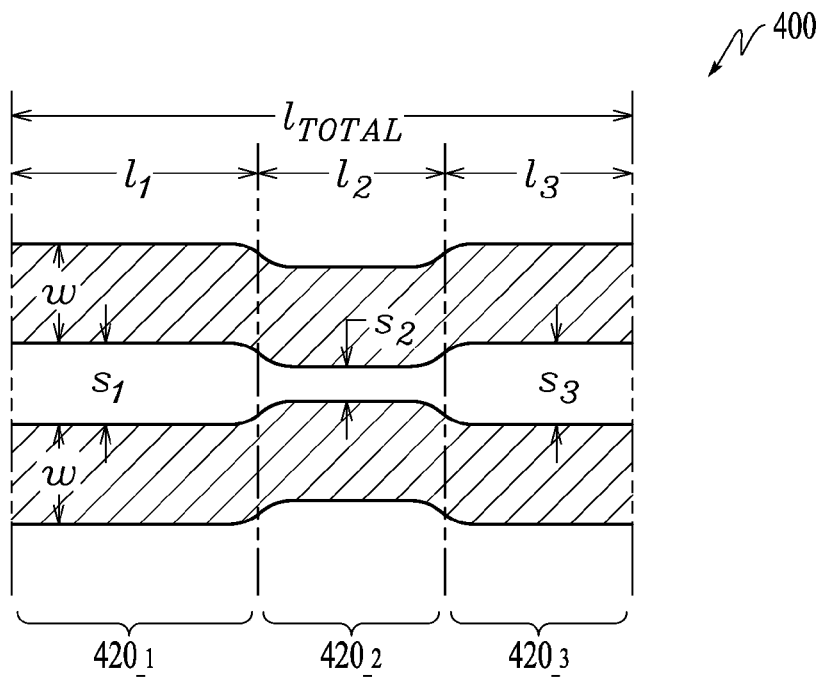
FIG. 4 shows an example of a transmission line.

FIG. 4 shows an example of a transmission line 400, such as transmission line 120, that can include a pair of traces in a proximal segment 420-1, a middle segment 420-2, and a distal segment 420-3. The transmission line 400 may be, for example, a differential pair of traces that may be described in terms of a characteristic impedance or a differential impedance. Each segment 420-1, 2, 3 can include a pair of traces. In segments 420-1, 2, 3, the pair of traces may be characterized in terms of a constant width, w, a variable spacing, and other parameters. For example, the spacing in segment 420-1, $s_1$, can equal the spacing in segment 420-3, $s_3$. The spacing in segment 420-2, $s_2$, may be decreased so that the characteristic impedance of this segment is reduced relative to the impedance of a 100Ω differential pair. It may be noted that the total length of segments 420-1, 2, 3 may be constrained to equal the sum of the individual segment lengths. It may also be noted that the lengths of segments 420-1 and 420-2 may be adjusted to reduce an insertion loss or increase a return loss for a semiconductor package, such as semiconductor package 100. It may also be noted that both the impedance and length of the segments may be adjusted to increase the knee frequency of the insertion loss frequency behavior.

In the foregoing discussion, it has been noted that the lengths of the first or proximal and middle segments 420-1 and 420-2 may be adjusted, however, the lengths of any pair of segments may be adjusted as well. In other words, segments 420-1 and 420-2 may be adjusted, or segments 4204 and 420-3, or segments 420-2 and 420-3. The total length of the segments 420-1 to 420-3 can be constrained to equal a pre-determined package trace length. For example, the total length of segments 420-1 to 420-3 can equal a prescribed distance between an I/O cell and a terminal in a SERDES package. Other constraints, such as minimum or maximum trace widths and spacings, material properties, wire bond lengths, and the like, may be established a priori by manufacturability requirements, production cost considerations, and the like. The constraints may be included in a performance optimization method that adjusts the characteristics of a transmission line as described further with respect to FIG. 8.

With respect to FIG. 4, it may be noted that capacitive discontinuities at the I/O cell 110a and terminal 130 can reduce the equivalent end-to-end impedance for frequencies above a knee frequency. For example, an impedance mismatch may reduce a differential impedance, measured starting at the I/O cell 110a, i.e., the equivalent impedance the I/O cell sees and ending just after the terminal 130, from 100 Ohms to approximately 60 Ohms for frequencies above the first resonance or knee frequency. The impedance of the transmission segments 120a2 and 120b2 can be adjusted to raise the differential impedance of the transmission line 120 to match 100 Ohms more closely above the knee frequency. The knee frequency may be determined before optimization and may increase as intended after optimization.

The knee frequency may be determined from a frequency-domain plot of a package or channel transfer characteristic, such as an insertion loss plot. The knee frequency may be described as that frequency for which the signal transmission coefficient rises to a local maximum. The knee frequency may also be determined from the point at which the package insertion loss is a given value, such as 0.5, 1, 2, 3, or 6 dB. It may be noted that it is often customary to describe insertion loss in positive units to quantify increased loss, but to plot insertion loss as increasing with larger magnitude negative numbers. In this context, it may be useful to regard insertion loss plots as transmission coefficient plots, expressed in dB, with 100% transmission corresponding to 0 dB insertion loss. This convention also applies to return loss, in other words, it is customary to refer to return loss in positive numbers while plotting it in negative numbers. An ideal return loss will be infinite and will be plotted as minus infinity.

Figure 5:
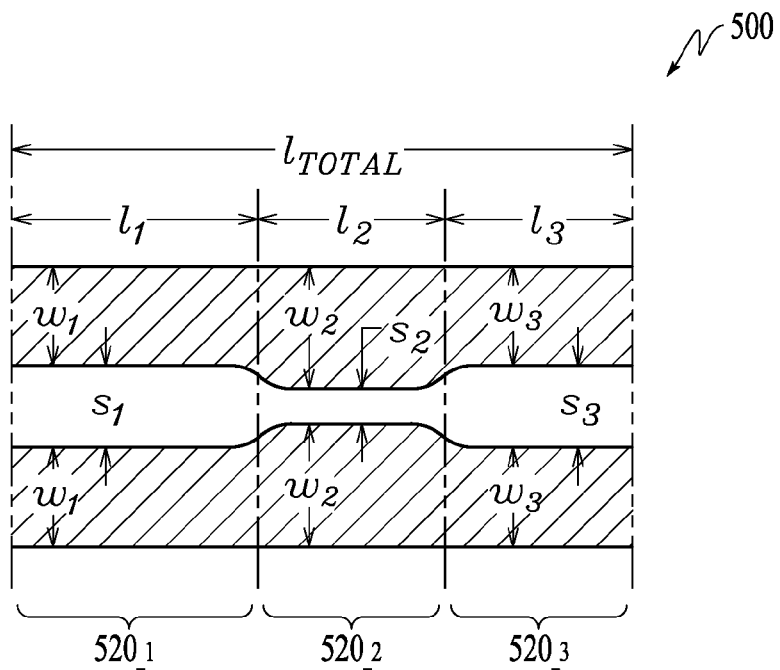
FIG. 5 shows an example of a pair of package traces.

FIG. 5 shows an example of a pair of package traces 500 for a multi-segment transmission line, such as transmission line 120. The corresponding features and functions of elements of FIG. 5 may be understood in light of FIG. 4. The impedance of the transmission line 500 can be modified due to alterations in a spacing and a width of conductors or package traces in a middle segment 520-2. For example, reducing the spacing between the pair of conductors in segment 420-2 can decrease the differential impedance of the pair from approximately 100Ω to approximately 60Ω. It may be noted that 100Ω may be regarded as a typical input or output impedance for SERVES circuits.

Figure 6:
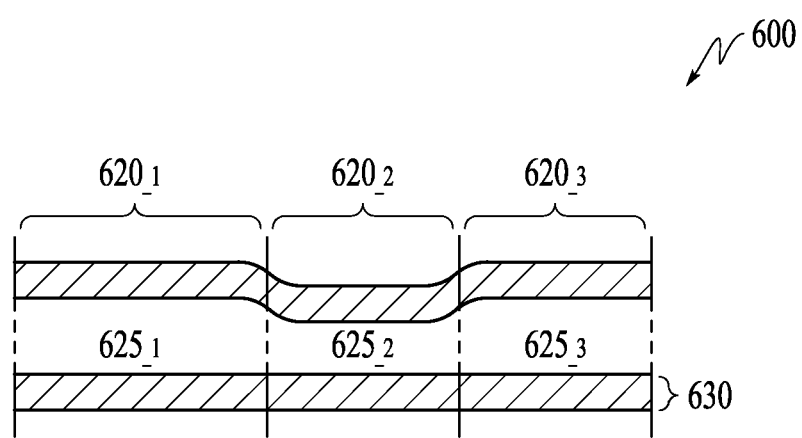
FIG. 6 shows an example of a package trace cross-section.

FIG. 6 shows an example of a package trace cross-section 600 that can include a proximal conductor segment 620-1, a middle conductor segment 620-2, a distal conductor segment 620-3, a near ground plane 630, and a far ground plane 635. The near and far ground planes 630 and 635, respectively, can be separated by dielectric segment 632. The package trace cross-section 600 can also include a proximal dielectric segment 625-1, a middle dielectric segment 625-2, and a distal dielectric segment 625-3.

The proximal conductor segment 620-1 and a distal conductor segment 620-3 can be referenced to the far ground plane 635. The middle conductor segment 620-2 can be referenced to the near ground plane 630, which is closer to the trace 605 in the middle conductor segment 620-2 and can lower the impedance of the middle conductor segment 620-2 relative to the impedance of the proximal conductor segment 620-1 and a distal conductor segment 620-3.

Figure 7:
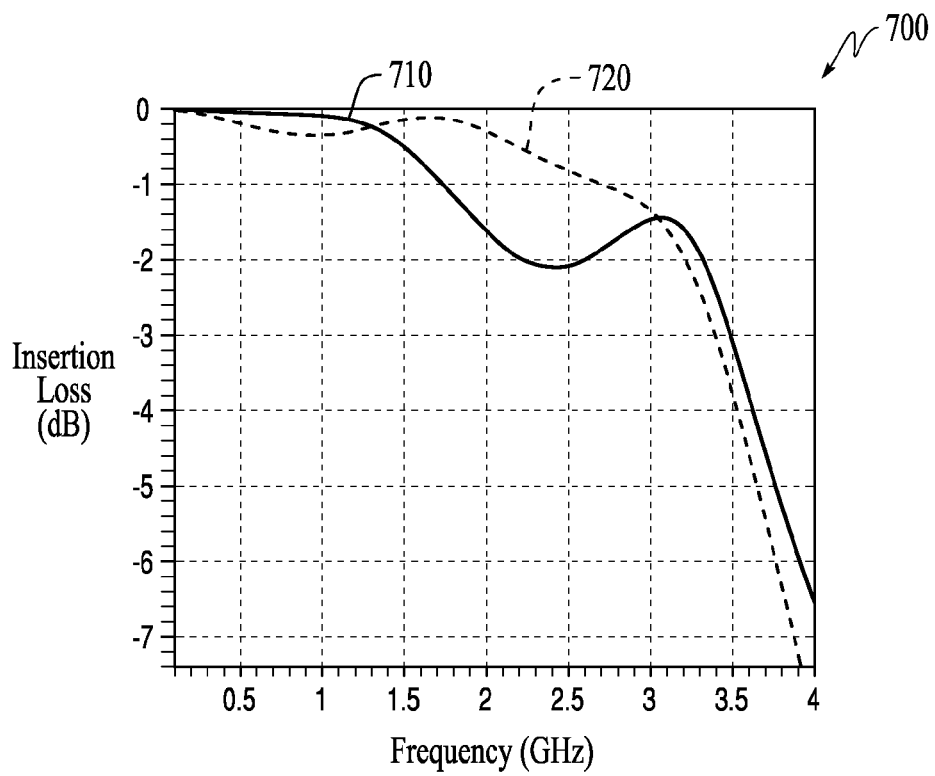
FIG. 7 shows an example of a frequency domain plot.

FIG. 7 shows an example of a frequency domain plot 700 that can include an unmodified package insertion loss 710 and a modified package insertion loss 720. The unmodified package insertion loss 710 can correspond to the frequency-dependent insertion loss plot 330 discussed with respect to FIG. 3. The modified package insertion loss plot 720 can show the broadening and flatting effects due to altering a transmission line segment, such as transmission line segments 420-2 or 520-2. The alterations can compensate for signal fidelity effects caused by impedance discontinuities, such as impedance discontinuities that are intrinsic to I/O cell 110a, the first or second couplers 115-125, terminal 130, or other package properties. The effects due to other package properties can include parasitic impedance changes that can occur after a semiconductor package, such as semiconductor package 100, is mounted to a PCB or a fixture. Other properties that the compensation process may take into account are board parasitic characteristics coupled to the terminals 130, such as board via capacitance.

Figure 8:
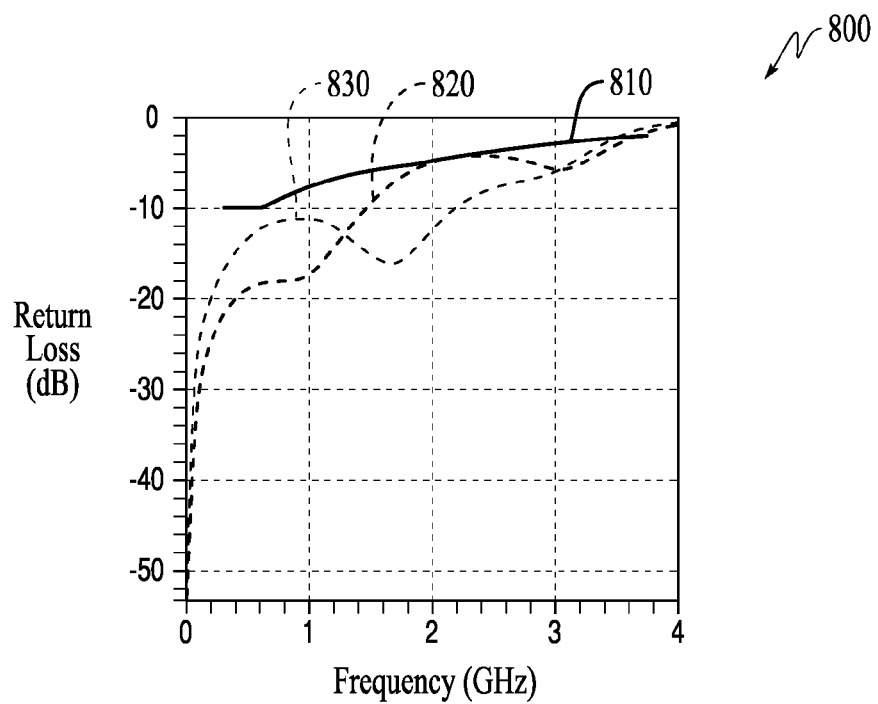
FIG. 8 shows an example of plots of return loss.

FIG. 8 shows an example of plots of return loss 800, measured in decibels (dB). FIG. 8 shows the frequency-dependence of return loss for frequencies between 0 and 4 GHz. FIG. 8 shows a specification limit 810, a return loss 820 for an unmodified package, and a return loss 830 for a modified package. The specification limit 810 may be obtained from a standards based design rule, such as a design rule based on a XAUI standard. The return loss 820 can show that the reflections between an I/O cell and a terminal approach or exceed a specification limit for one or more frequencies within a range of frequencies for which the specification applies. For example, the return loss 820 may nearly equal the specification limit 710 at 2.2 GHz. Return loss 830 shows that modifications or optimization of a transmission line, such as transmission line 120, can improve the return loss of the modified package relative to the specification limit. For example, the return loss may improve by 5.5 dB at 2.2 GHz.

It may be noted that the disclosed devices and methods may improve the insertion loss and the return loss for a range of frequencies that correspond to a significant fraction of the power in a digital I/O signal. For example, the losses may improve over a 3 dB bandwidth, a 1 dB bandwidth, a 80% integrated PSD bandwidth, a 90% integrated PSD bandwidth, and the like. For example, the insertion loss may improve by an average of 2.5 dB over a bandwidth that corresponds to 80% of the integrated PSD. The fraction may be predetermined or measured using the PSD of a random or near random digital data signal. For example, a digital signal, such as a XAUI channel with a line rate of 3.125 bps can exhibit a center of mass approximately equal to the line rate divided by $\pi$, e.g., 1 GHz. The 10% and 90% frequencies of the integrated PSD for the XAUI signal can correspond to approximately 125 MHz and 2.5 GHz, respectively. It may be noted that the frequency at which 90% of the PSD is encompassed may be a function of the rise time.

The substantial increase in return loss as shown in plots 820 and 830, with respect to the specification limit 810 can improve the fidelity of a digital signal. The improved signal fidelity due to insertion loss and return loss improvements may be manifested in terms of a performance function such as: reduced time jitter, increased eye opening, increased eye margin, reduced bit error rate or bit error ratio, improved timing margin, increased peak signal-to-noise ratio, reduced eye opening mask hits, and the like. The Q factor may be described as a quality factor or performance metric of the eye diagram of a binary digital signal. The Q factor may be computed from the difference in the mean level of a digital ONE and a digital ZERO, divided by the sum of the standard deviation of the ONE and the ZERO. The eye opening may be the described as the difference in a statistical minimum level of the digital ONE and a statistical maximum level of the digital ZERO. In other words, an eye opening may be computed using likely worst-case statistical metrics, for example.

Figure 9:
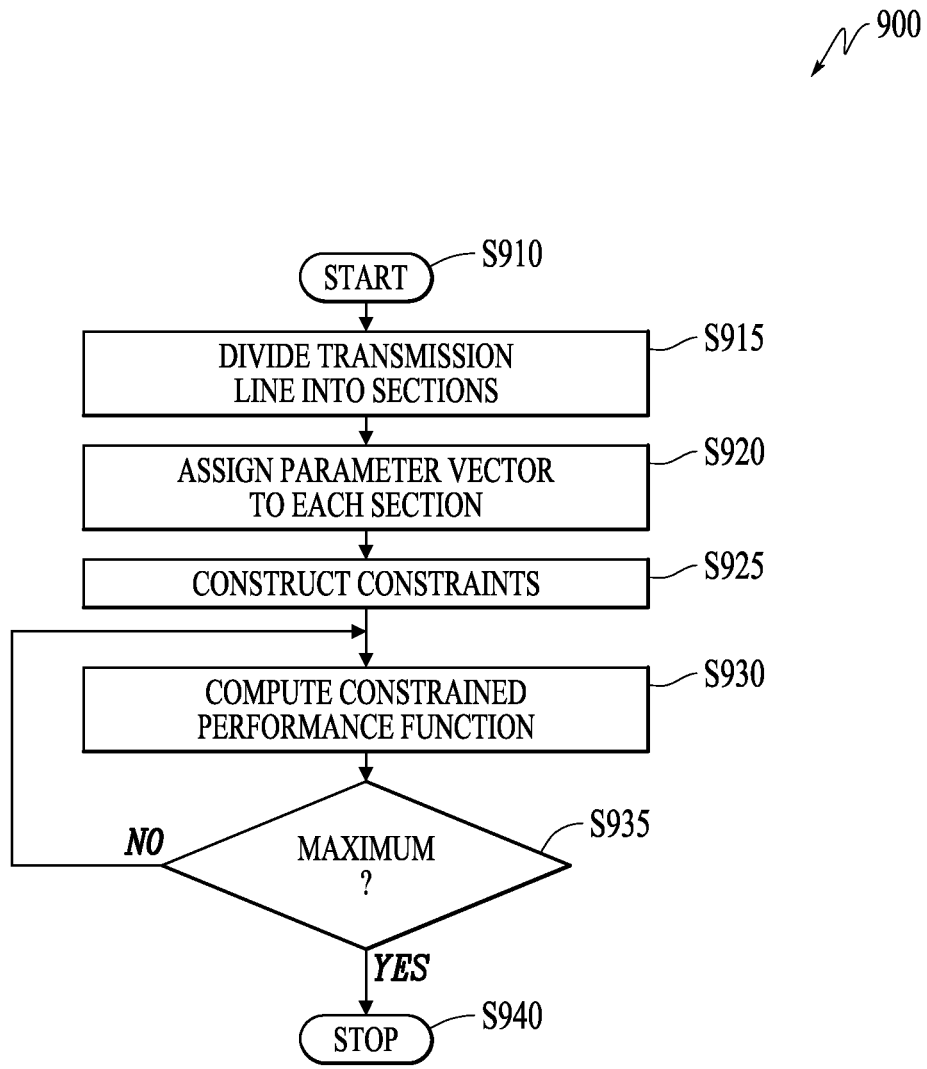
FIG. 9 shows an example of a method that can determine an optimized transmission line.

FIG. 9 shows a flowchart of an example method 900 that can determine an optimized transmission line for transporting a digital I/O signal from an output cell of a semiconductor chip to a terminal. The optimized transmission line can transport the signal without distorting amplitude characteristics, distorting phase characteristics, or incurring significant signal reflection from the I/O chip to the terminal or vice versa. In other words, the optimized transmission segment can transport signal between the I/O cell and the terminal while maintaining an essentially linear phase characteristic. The optimized transmission line can maximize a constrained performance function or signal fidelity function such as: a real power transfer coefficient between the I/O cell and the terminal, a transmission coefficient, a reflection loss, a Q statistic, an insertion loss, an integral of the insertion loss over a predetermined frequency, a knee frequency, and the like.

The program 900 can begin at step S910 and can proceed to step S915 in which a transmission line of a predefined or a constrained length may be divided into segments. For example, the transmission line may be divided into a proximal segment, a middle or central segment, and a distal segment. Dividing the transmission line into segments does not necessarily mean that the length of each segment is predetermined. In other words, the number of segments may be determined but the length of each segment may be regarded as a parameter for a subsequent performance-optimizing calculation. The total number of segments may also be regarded as a parameter for optimization.

From program step S915, program flow can proceed to program step S920 in which a trial parameter vector is assigned to each segment. The parameter vector can include the length of each segment, trace widths, trace spacings, permittivities, conductivities, characteristic impedances, differential impedances, and the like. For example, the parameter vector of the first segment can include the segment length and the parameter vector of the second or middle segment can include a trace spacing and a segment length.

From program step S920, program flow can proceed to program step S925 in which one or more constraints can be constructed. For example, the sum of the lengths of each segment may equal the total length of the transmission line from an I/O cell to a terminal. In other words, the total length of the transmission line may be a constraint on the individual transmission lines. As a further example, the width of a transmission line in one segment may be constrained to equal the width of a transmission line trace in another segment. Program step S925 may also include constraints that impose a manufacturability requirement. For example, the minimum or a maximum trace width or trace spacing in a differential pair may be constrained by manufacturing considerations. The constraints may be implemented using equations of constraint, Lagrange multipliers, and the like.

From program step S925, program flow can proceed to program step S930 in which a constrained performance function is computed using a trial set of parameters or parameter vectors. The performance function may minimize an insertion loss, maximize a return loss, maximize a real power transfer coefficient, maximize a linear phase portion of a broadband signal that is transferred between the I/O cell and the terminal, maximize a Q function, minimize the integral of an insertion loss up to a pre-determined frequency, maximize a knee frequency, and the like. The equations of constraint may be included in the calculation of the performance function so that, for example, manufacturing requirements, and the requirement on the total length of the transmission line are satisfied, as described with respect to step S920.

It may be noted that in program step S930, the performance function may include a norm of a difference between the trial transfer function of the transmission line and a reference transmission or channel characteristic. For example, the trial transmission characteristic may be compared with a zero loss, linear-phase transfer characteristic, a Bessel function characteristic, and the like. The norm can be an L1, or absolute-value norm, an L2 or mean-square norm, an L∞ or worst-case norm, and the like. In other words, the minimum insertion loss and maximum return loss may be simultaneously satisfied by a conservation of energy argument when using an L2 norm, Alternatively, an L∞ norm can minimize a worst-case deviation of the transmission line characteristic from an ideal characteristic, such as a zero loss, linear-phase characteristic, over a predefined bandwidth of a broadband signal. The program step S930 can select a new, trial set of parameters for subsequent iterations.

From program step S930, program flow can proceed to program step S935 in which the constrained performance result can be compared to a maximum-seeking or algorithm-stopping criterion. For example, the performance result may be compared with a previous performance function calculation to determine if an extremum has been reached, the gradient of the performance function is approximately zero, the performance function result exceeds a performance requirement, and the like.

From program step S935, program flow can proceed to program step S940, in which program execution can stop.

While the invention has been described in conjunction with the specific exemplary embodiments thereof, it is evident that many alternatives, modifications, and variations will be apparent to those skilled in the art. Accordingly, embodiments of the invention as set forth herein are intended to be illustrative, not limiting. There are changes that may be made without departing from the spirit and scope of the invention.

What is claimed is:

1. A circuit package comprising:
   at least a first trace and a second trace that are symmetrical with each other and include a plurality of portions characterized by a portion-dependent impedance to transfer an electronic signal between an input port and an output port;
   a first portion of the first trace and the second trace having a first impedance; and
   a second portion of the first trace and the second trace having a second impedance different from the first impedance.

2. The circuit package of claim 1, further comprising:
   a signal input port configured to receive the electronic signal that includes multiple frequency components; and
   a signal output port that is configured to output the electronic signal.

3. The circuit package of claim 1, wherein the electronic signal is a differential signal.

4. The circuit package of claim 1, wherein the input port and output port are terminals.

5. The circuit package of claim 1, wherein the first trace and second trace each include:
   a third longitudinal portion that has a third impedance that is different from the second impedance.

6. The circuit package of claim 5, wherein the third impedance is the same as the first impedance.

7. The circuit package of claim 5, wherein the second impedance is less than the first impedance.

8. The circuit package of claim 1, wherein the second impedance is greater than the first impedance.

9. The circuit package of claim 1, wherein the first trace and the second trace are symmetrical with each other so that the first portion of the first and second trace have a first inter-pair spacing and the second portion of the first and second trace have a second inter-pair spacing that is different than the first inter-pair spacing.

10. The circuit package of claim 1, wherein the first trace and the second trace are symmetrical with each other so that at the first portion of the first trace and the second trace have a first width, and at the second portion of the first trace and the second trace have a second width that is different than the first width.

11. The circuit package of claim 1, wherein the first trace and the second trace are symmetrical with each other so that the first trace and the second trace have a first thickness at the first portion, and the first trace and the second trace have a second thickness at the second portion that is different than the first thickness.

12. A method for reducing signal loss of an electronic signal in integrated circuit packaging, the method comprising:
    transferring an electronic signal from an input port to an output port over a transmission line that includes a first trace and a second trace that are symmetrical with each other and each have a plurality of portions characterized by a portion-dependent impedance; and
    minimizing an insertion loss between the input port and the output port for the electronic signal by configuring the transmission line to have an impedance of a center portion of the portions to be different than an impedance of an end portion and by setting a first plane spacing of the first and second traces at the center portion to be different than a second plane spacing of the first and second traces at the end portion.

13. The method of claim 12, wherein transferring the electronic signal from the input port to the output port includes conducting the electronic signal over a differential pair of traces.

14. The method of claim 12, wherein the impedance of the center portion is higher than the end portion.

15. The method of claim 12, wherein the impedance of the center portion is lower than the end portion.

16. The method of claim 12, wherein the minimizing an insertion loss between the input port and the output port includes setting a first inter-pair spacing of the first and second traces at the center portion to be different than a second inter-pair spacing of the first and second traces at the end portion.

17. An electronic package having a first trace and a second trace that are symmetrical with each other, each trace comprising:
    a first transmission segment having a first impedance and configured to receive a signal from a generator;
    a second transmission segment having a second impedance configured to conduct the signal to a load; and
    a third transmission segment, coupled between the first and second transmission segments and having a third impedance that is different from the first and second impedance, the third transmission segment configured to maximize a return loss of the electronic package at a frequency less than a line rate, the maximized return loss being greater than 10 dB for all frequencies less than one half the line rate.

18. The electronic package of claim 17, wherein the signal includes a plurality of frequency components.

19. The electronic package of claim 17, wherein the generator is a semiconductor chip in the electronic package and the load is a terminal of the electronic package.

20. The electronic package of claim 17, wherein the load is a semiconductor chip in the electronic package and the generator is a terminal of the electronic package.

21. The electronic package of claim 17, wherein the third transmission segment is configured to maximize a portion of the signal that arrives at the load, the portion having a substantially linear phase relationship to the signal.

22. An electronic package having a first trace and a second trace that are symmetrical with each other, each trace comprising:
    a first transmission segment having a first impedance configured to receive a signal from a generator;
    a second transmission segment having a second impedance configured to conduct the signal to a load; and
    a third transmission segment, coupled between the first and second transmission segments, having a third impedance different from the first impedance and the second impedance, the third impedance being selected to maximize a performance function of the signal from the generator to the load over a predefined frequency band of the signal.

* * * * *